United States Patent [19]
Triplett: Gerald H. et al.

[11] 3,935,372
[45] Jan. 27, 1976

[54] METHOD AND APPARATUS FOR MODIFYING WIRE-WRAPPED BACK PLANES

[75] Inventors: Gerald H. Triplett; Plymouth; Edward A. Nicol; William G. Klehm, Jr., both of Farmington, all of Mich.

[73] Assignee: Burroughs Corporation, Detroit, Mich.

[22] Filed: Aug. 2, 1974

[21] Appl. No.: 494,213

[52] U.S. Cl. ............ 174/68.5; 29/628; 317/101 CC; 317/101 CM; 339/18 C
[51] Int. Cl.² ........................................ H05K 1/04
[58] Field of Search. 174/68.5; 317/101 B, 101 CM, 317/101 D, 101 CE, 101 CW, 101 CC; 339/17 C, 18 B, 18 C, 18 R, 19; 29/626, 628, 203 B, 203 J, 203 MW; 160/92.1

[56] References Cited
UNITED STATES PATENTS

| | | | |
|---|---|---|---|
| 2,965,812 | 12/1960 | Bedford, Jr. | 317/101 CC |
| 3,083,261 | 3/1963 | Francis et al. | 29/627 C X |
| 3,279,040 | 10/1966 | Propster, Jr. | 29/628 |
| 3,296,362 | 1/1967 | Parry | 174/68.5 X |
| 3,405,324 | 10/1968 | Alexander et al. | 317/101 CC |
| 3,509,268 | 4/1970 | Schwartz et al. | 174/68.5 |
| 3,591,922 | 7/1971 | Pardee et al. | 317/101 CC |
| 3,660,726 | 5/1972 | Preston et al. | 317/101 CM |

*Primary Examiner*—Darrell L. Clay
*Attorney, Agent, or Firm*—Ronald L. Taylor; Edwin W. Uren; Paul W. Fish

[57] ABSTRACT

An improved circuit modification method is provided for wire-wrapped electrical back planes such that changes in the back plane circuitry may be accomplished in areas remote from a production facility where wire-wrap equipment and highly skilled technicians may not be available, such method involving the preparation of a slip-on, post-terminal-compatible printed circuit board at the production facility, delivery of the printed circuit board to the remote area, and the slip-on attachment of the printed circuit board onto the post terminals of the back plane by a repairman who may be unfamiliar with the intricacies of the back plane and its wire-wrapped interconnections, said slip-on printed circuit board being inherently provided with whatever guidance may be required by the repairman in effectuating its installation on the back plane.

7 Claims, 4 Drawing Figures

METHOD AND APPARATUS FOR MODIFYING WIRE-WRAPPED BACK PLANES

BACKGROUND OF THE INVENTION

1. Field of the Invention

This invention relates to the assembling of electrical circuitry and more particularly to the installation of electrical connections between selected post terminals of a wire-wrapped back plane.

2. Prior Art

The back plane to which the present invention particularly applies is generally provided with a plurality of plug-in type modules mounted in a frame, one side of the back plane and modules being provided with symetrically arranged receptacles for receiving the flatted or planar terminals of printed circuit cards, and the other side of the back plane and modules being provided with a plurality of integrally formed post terminals which are variously interconnected by wires the ends of which have been wrapped therearound by means of automatic wire-wrapping equipment.

Whenever such a wire-wrapped back plane located at a remote point or on a users premises required modification, such as to accommodate a new or changed feature of the electronic circuitry of which the back plane formed a part, it was heretofore necessary either to ship the back plane to a production facility or to a well-equipped modification center for the incorporation of the required wiring changes, or to send a highly skilled technician to the users premises for the manual and laborious incorporation of such changes, the first named alternative normally entailing considerable expense, delays, and interruptions in service to the user, and the last named alternative being particularly susceptible to error by reason of the extreme difficulty of locating and identifying the precise post terminals to be interconnected.

SUMMARY OF THE INVENTION

It is accordingly an object of the present invention to provide an improved and simplified method for incorporating new features and changed characteristics in a wire-wrapped back plane, and for making the post terminal interconnections required thereby.

It is a further object of the present invention to eliminate from the wire changing process the time-consuming task of locating and identifying the precise post terminals in the back plane that require interconnection.

It is still another object of the present invention to greatly reduce the high incidence of error that has heretofore attended the manual incorporation of wiring changes in a wire-wrapped back plane.

It is yet another object of the present invention to so simplify the wire-changing process that a technician of ordinary skill might effect the required post terminal interconnections without first familiarizing himself with the detailed intricacies of the particular back plane.

Still another object of the present invention is to provide an improved wire-changing method that inherently affords segregation as between a particular back plane modification and the back plane wiring as it was originally produced, such that an outmoded modification might be readily removed from the back plane as a precedent to the incorporation of a subsequent change.

In carrying out the objects of the invention, a printed circuit board having apertures corresponding to the post terminals of the back plane has been provided, the printed circuit on the face of the board comprising at least a portion of the post terminal interconnections that are to be made in the back plane, and the apertures formed in the board permitting slip-on connection of the printed circuit board onto the post terminals of the back plane, the printed circuit board, upon said slip-on installation, providing either all of the post terminal interconnections that are required of the modification, or graphic instructions to the technician whereby jumper wires connected at one end to the printed circuit on the board may be connected to graphically identified post terminals of the back plane to complete the required post terminal interconnections.

BRIEF DESCRIPTION OF THE DRAWINGS

Various other objects, advantages and meritorious features of the invention will become more fully apparent from the following specification, appended claims and accompanying drawing sheets.

The features of two specific embodiments of the invention are illustrated in the drawing, in which.

DESCRIPTION OF A PREFERRED EMBODIMENT

Figure 1:
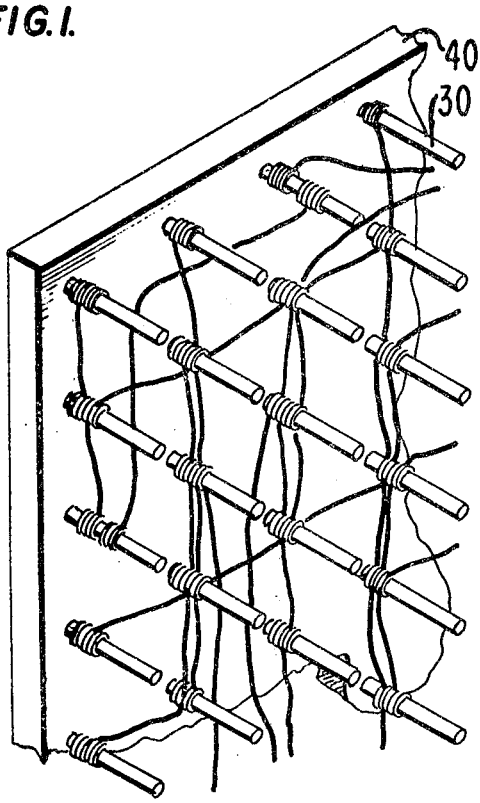
FIG. 1 shows a portion of a wire-wrapped back plane.
Figure 3:
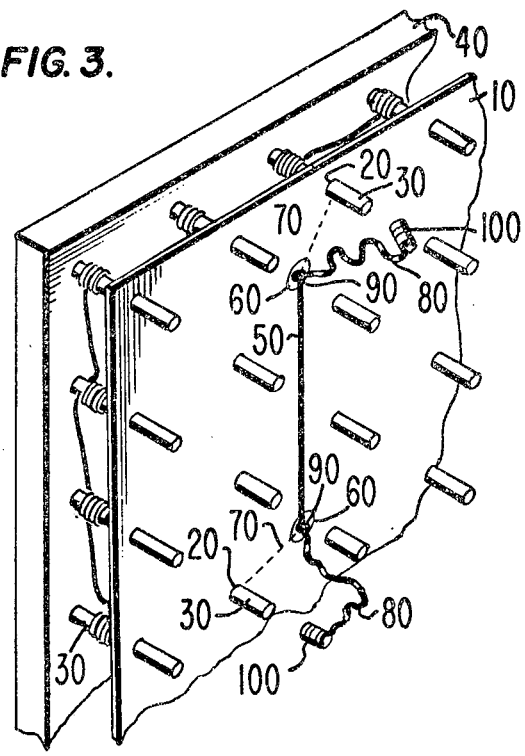
FIG. 3 shows the printed circuit board of FIG. 2 inserted over the post terminals of the back plane of FIG. 1.
Figure 2:
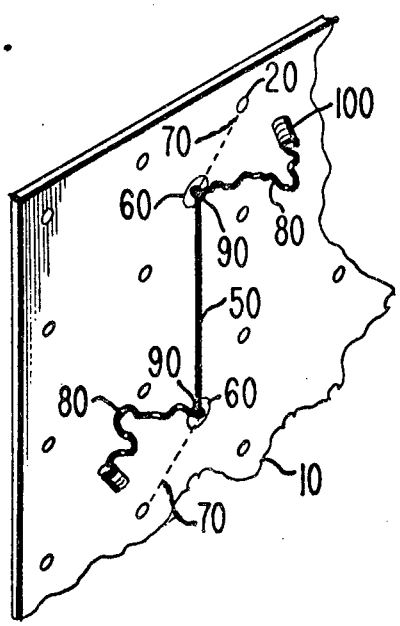
FIG. 2 shows one embodiment of the invention wherein a printed circuit board having apertures corresponding to the post terminals of the back plane of FIG. 1 is provided with a printed circuit that interconnects a pair of circuit terminals to which are connected a pair of jumper wires capable of being connected to a pair of post terminals requiring interconnections.

Referring to FIGS. 1 through 4 by the characters of reference there is illustrated a method and apparatus for carrying out the objects of the invention. The apparatus of the invention consists of a printed circuit board 10 having apertures 20 corresponding to the post terminals 30 of a wire-wrapped back plane 40 which is to be modified in some predetermined manner, the board 10 being provided with the desired printed circuits 50, circuit terminals 60 fixed to the circuits 50, end anchored jumper wires 80 including SNAP-ON or slip-on terminal connectors 100, jumper wire anchorings 90, and graphically illustrated jumper wire pathways 70. The first step of the method of the invention, then, is the selection of a board 10 and the formation of a matrix of apertures 20 therein corresponding to the post terminals 30 of the back plane 40. A second step of the method of the invention is the application or formation of the desired printed circuit 50 on the printed circuit board 10, as by a subtractive process such as etching or other conventional method including additive or subtractive processes. Determination of the pattern of the printed circuit 50 would of course be based upon the character and configuration of the original wire-wrapping of the back plane 40, and upon the nature of the wiring changes that are required to be made therein. The printed circuit terminals 60 for any given segment of the printed circuit 50 may be disposed inwardly adjacent a pair of apertures 20 corresponding to a pair of post terminals to be connected, as is the case in the preferred embodiment, or may be disposed in coincidence with said pair of apertures as subsequently described in connection with another embodiment of the invention. In the event the circuit terminals 60 are to be disposed inwardly adjacent the apertures 20, the above described second step of the method would include the application of graphically illustrated jumper wire pathways 70 leading from the circuit terminals 60 to the apertures 20 corresponding to the post terminals to be connected, such pathways being in the nature of broken or dotted lines as illustrated in FIGS. 2 and 3. A provisional third step of the method would accordingly be the attachment of the circuit terminals 60 to the terminal ends of each segment of the printed circuit 50, as by soldering, and by establishing the jumper wire anchorings 90 by soldering one end of a jumper wire 80 to each of the circuit terminals 60, each of the jumper wires 80 being provided with a slip-on terminal connector 100 prior to its soldering to a circuit terminal 60.

Figure 4:
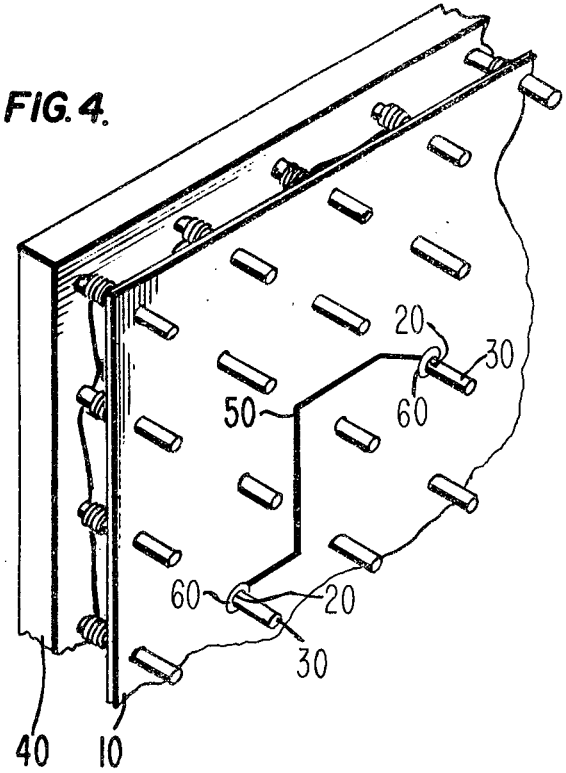
FIG. 4 shows another embodiment of the invention wherein a printed circuit board installed on a back plane is provided with circuit segments which are connected by plated through holes, the plated through holes serving to complete the interconnection of selected post terminals.

A fourth step of the preferred method of the invention, then, includes the installation of the printed circuit board 10 onto the post terminals 30 of the back plane 40, as illustrated in FIGS. 3 and 4, and the forceable attachment of the slip-on terminal connectors 100 of the jumper wires 80 to the post terminals 30 disposed at the termination points of the graphically illustrated jumper wire pathways 70. Once the printed circuit board 10 is installed onto the post terminals 30 of the back plane 40, the frictional force between the post terminals 30 and the walls of apertures 20 will serve to hold the printed circuit board 10 in place, such holding force being augmented by the forceably attached slip-on terminal connectors 100 should said terminal connectors 100 be of greater outer diameter than the inner diameter of the apertures 20.

Another embodiment of the apparatus and method may be provided by modifying the second step application of the printed circuit 50 such that each segment of the printed circuit 50 extends to a rim-abutting relationship with the pair of apertures 20 corresponding to the pair of post terminals to be connected, and by adding thereafter the subordinate step of plating-through each such pair of apertures 20, the circuit terminals 60 for each circuit segment in such case being coincidably disposed relative to the pair of apertures 20 interconnected by the segment, and consisting of the plated-through apertures which are mechanically and electrically connected to the terminal ends of the circuit segment. This modified method would eliminate the need of the jumper wires 80 and of the jumper wire pathways 70, the desired interconnection of the post terminals 30 of the back plane 40 being accordingly accomplished by the various segments of the printed circuit 50 and of the plated-through apertures 20 that are received by the post terminals 30 requiring interconnection, such post terminals being receivably and contractably disposed within the plated through apertures 20 after installation of printed circuit board 10 onto the post terminals of the back plane.

Included among the many advantages of the present apparatus and method are: (1) a particular modification of a wire-wrapped back plane may conveniently be removed upon the occurrence of its obsolescence, by simply reversing the steps of the method enumerated above; (2) individual wiring modifications that have been made on a back plane will be readily reorganizable by a technician, in that they will be physically segregated from the original back plane wiring; and (3) the development of the printed circuit boards required for future back plane modifications will be facilitated in that each future modification may emanate from the original and uncontaminated state of the back planes wiring configuration, with complete disregard to the intricacies of intervening modifications, it being recognized that all or any part of a preceding modification may be incorporated in the printed circuit board that is developed at the production facility for any particular new modification.

While the above referenced embodiments of the invention have been described in considerable detail, both with respect to the apparatus and method thereof, it will be appreciated that other modifications and variations therein may be made by those skilled in the art without departing from the true spirit and scope of the invention.

What is claimed is:

1. The method of effecting wiring changes in the interconnection of the post terminals in a back plane, to thereby modify the operational characteristics of the back plane, said method comprising the steps of:
    a. forming a matrix of apertures in a board suitable for receiving a printed circuit, said matrix corresponding to the plurality of post terminals on the back plane,
    b. forming a printed circuit on the surface of said board including a plurality of circuit segments, each of said circuit segments partially spanning the distance between a pair of selected apertures corresponding to a pair of post terminals requiring interconnection,
    c. forming a pair of circuit terminals at the terminal ends of each of said circuit segments,
    d. applying a pair of graphic pathways on the surface of said board for each of said circuit segments, each of said pairs of graphic pathways leading from the circuit terminals of a circuit segment to the said pair of selected apertures partially spanned thereby, each of said pairs of graphic pathways terminating at and serving to identify a pair of selected apertures corresponding to a pair of post terminals requiring interconnection,
    e. affixing one end of a jumper wire to each of said circuit terminals,
    f. mounting said board with said printed circuit, said jumper wires and said graphic pathways onto the post terminals of the back plane with each aperture of said matrix of apertures being received over its corresponding post terminal of the back plane, and
    g. electrically connecting the free end of each of said jumper wires to the post terminal receivably disposed within the selected aperture identified by the graphic pathway leading from the circuit terminal to which it is affixed.

2. The method defined in claim 1 wherein said step of forming a printed circuit and the circuit segments thereof on the surface of said board is accomplished by an etching process.

3. The method defined in claim 1 wherein the graphic pathways leading from said circuit terminals to the selected apertures partially spanned by said circuit segments are produced by an etching process in the form of broken or dotted lines.

4. The method defined in claim 1 wherein the step of affixing one end of a jumper wire to each of said circuit terminals is effected by soldering said one end thereto.

5. The method defined in claim 1 wherein said step of electrically connecting the free end of each of said jumper wires to the post terminal receivably disposed within the selected aperture identified by the graphic pathway leading from each of said circuit terminals is effected by:
  a. connecting a slip-on terminal connector to each of said free ends of said jumper wires, and
  b. forceably attaching said slip-on terminal connectors to the post terminals receivably disposed within said selected apertures identified by said graphic pathways.

6. Apparatus for use in effecting wiring changes in the interconnection of the post terminals in a back plane to thereby modify the operational characteristics thereof, said apparatus comprising:
  a. a printed circuit board having a matrix of apertures corresponding to the post terminals of the back plane, said printed circuit board including a plurality of circuit segments each partially spanning a pair of selected apertures corresponding to a pair of post terminals that require interconnection,
  b. a pair of circuit terminals connectably disposed at the terminal ends of each of said circuit segments,
  c. a plurality of graphic pathways leading from said circuit terminals and terminating at and identifying selected apertures corresponding to the post terminals to be connected thereto, and
  d. a plurality of jumper wires attached at one end to each of said circuit terminals and having at their free ends a slip-on terminal connector, whereby upon installation of said printed circuit board on the post terminals of the back plane and the forceable attachment of each of said slip-on terminal connectors to the post terminals receivably disposed within said selected apertures identified by said graphic pathways, the interconnection of the post terminals requiring interconnection according to the desired modification of the operational characteristics of the back plane will have been made.

7. A printed circuit board effective for modifying the operational characteristics of a wire-wrapped back plane by effecting wiring changes therein relative to the post terminals thereof, said printed circuit board comprising:
  a. a matrix of apertures corresponding to the post terminals of the wire-wrapped back plane,
  b. a plurality of circuit segments each partially spanning a pair of selected apertures corresponding to a pair of post terminals that require interconnection,
  c. a pair of circuit terminals connectably disposed at the terminal ends of each of said circuit segments,
  d. a plurality of graphic pathways leading from said circuit terminals and terminating at and identifying selected apertures corresponding to the post terminals to be connected thereto, and
  e. a plurality of jumper wires attached at one end to each of said circuit terminals and having at their free ends a slip-on terminal connector, whereby upon installation of said printed circuit board on the post terminals of the wire-wrapped back plane and the forceable attachment of each of said slip-on terminal connectors to the post terminals receivably disposed within said selected apertures identified by said graphic pathways, the wiring changes required of a desired modification in the operational characteristics of a wire-wrapped back plane will have been made.

* * * * *